(12) United States Patent
Lin (10) Patent No.: US 11,652,190 B2
(45) Date of Patent: May 16, 2023

(54) SEMICONDUCTOR COMPONENT WITH OXIDIZED ALUMINUM NITRIDE FILM AND MANUFACTURING METHOD THEREOF

(71) Applicant: SKY TECH INC., Hsinchu County (TW)

(72) Inventor: Jing-Cheng Lin, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 142 days.

(21) Appl. No.: 17/204,916

(22) Filed: Mar. 17, 2021

(65) Prior Publication Data
US 2022/0199860 A1 Jun. 23, 2022

(30) Foreign Application Priority Data

Dec. 18, 2020 (TW) .................................. 109145098

(51) Int. Cl.
| | |
|---|---|
| *H01L 33/00* | (2010.01) |
| *H01L 33/32* | (2010.01) |
| *H01L 33/06* | (2010.01) |
| *C30B 29/40* | (2006.01) |
| *C23C 14/56* | (2006.01) |
| *H01L 21/67* | (2006.01) |
| *C23C 14/54* | (2006.01) |

(52) U.S. Cl.
CPC ............ *H01L 33/32* (2013.01); *C23C 14/541* (2013.01); *C23C 14/568* (2013.01); *C30B 29/406* (2013.01); *H01L 21/67109* (2013.01); *H01L 33/0075* (2013.01); *H01L 33/06* (2013.01)

(58) Field of Classification Search
CPC ..... C30B 25/183; C30B 29/406; H01L 33/20; H01L 33/06; H01L 33/0075; H01L 33/32; H01L 33/12; H01L 21/67109; C23C 14/541; C23C 14/566; C23C 14/568
See application file for complete search history.

(56) References Cited

U.S. PATENT DOCUMENTS

| | | | |
|---|---|---|---|
| 11,211,527 B2* | 12/2021 | Wildeson | ................ H01L 33/20 |
| 11,597,999 B2* | 3/2023 | Lin | ......................... C23C 14/58 |
| 2005/0100069 A1* | 5/2005 | Gwo | ................... H01S 5/18388 |
| | | | 372/50.1 |
| 2021/0262082 A1* | 8/2021 | Lin | ................... H01L 21/67201 |

* cited by examiner

*Primary Examiner* — Savitri Mulpuri
(74) *Attorney, Agent, or Firm* — Chun-Ming Shih; Hdls Ipr Services (57) ABSTRACT

The present disclosure is a light-emitting diode (LED) with oxidized aluminum nitride (oxidized-AlN) film, which includes a substrate, an aluminum nitride buffer (AlN-buffer) layer, an oxidized-AlN film and a light-emitting diode epitaxial structure. The AlN-buffer layer is disposed on a patterned surface of the substrate, wherein the patterned surface is formed with a plurality of protrusions and a bottom portion. The oxidized-AlN film is disposed on the AlN-buffer layer on the protrusions, and with none disposed on the AlN-buffer layer on the bottom portion. The LED epitaxial structure includes gallium nitride compound crystal formed on the oxidized-AlN film and the AlN-buffer layer, to effectively reduce defect density of the gallium nitride compound crystal and to improve a luminous intensity of the LED.

11 Claims, 10 Drawing Sheets

SEMICONDUCTOR COMPONENT WITH OXIDIZED ALUMINUM NITRIDE FILM AND MANUFACTURING METHOD THEREOF

TECHNICAL FIELD

The present disclosure relates to a semiconductor component with oxidized aluminum nitride film, more particularly a light-emitting diode with oxidized aluminum nitride film, which can effectively reduce defect density of the gallium nitride compound crystal, and facilitate improving brightness, luminous intensity of the light-emitting diode.

BACKGROUND

Light-emitting diodes (LEDs) have advantages such as high conversion efficiency, long lifetime, small-sized and high-level safety, thus already become new-generation light sources. Besides, the LEDs also have replaced traditional cold cathode tubes as new backlight sources of display panels, especially adapted to small-sized portable electronics, such as notebook computers, cell phones and tablet computers.

Liquid-crystal displays (LCDs) do not emit light by themselves and have a drawback of low efficiency, even when an LCD is showing white color, usually there is merely less than 10% of light emitted by the backlight source that can pass through the display panel, which consumes more electric power of the portable electronic. Moreover, besides of the backlight source, the LCDs further require more components, such as polarizers, liquid crystal and color filters to perform, therefore it is difficult to reduce size of the LCDs.

On contrary, organic LEDs (OLEDs) have advantages of self-lighting, wide viewing angle, high-contrast, power-saving, high responding speed and flexibility, such that the OLEDs are replacing the LCDs to become the new-generation electronics. However, the OLEDs still have drawbacks, such as screen burn-in, short lifetime, color decay and pulse-width modulation (PWN), as so, top brands in the industry are developing next-generation display panels.

So far, the micro LED displays have a great opportunity to become the next-generation display panels. The micro LED displays are also self-lighting, and further have advantages of high color saturation, short responsive time and long lifetime.

Currently, to commercialize micro LEDs, there are yet many technical and cost difficulties to overcome. In manufacturing of LEDs, metalorganic chemical-vapour deposition (MOCVD) is mainly employed to grow epitaxial structure on a sapphire substrate, to form an LED epitaxial wafer. The sapphire substrate is made of alumina, the epitaxial structure is made of gallium nitride, both have a great difference in crystal size. Therefore, when forming gallium nitride on the sapphire substrate, a great number of crystal lattice mismatches and threading dislocations can easily occur therebetween, then reduce brightness, luminous intensity of the LEDs. Due to the micro LEDs are further smaller than conventional LEDs, the aforementioned drawback can be much more apparent for the micro LEDs.

SUMMARY

To solve the problem of the conventional technology, the present disclosure provides a semiconductor component with oxidized aluminum nitride (oxidized-AlN) film, more particular a light-emitting diode (LED) with oxidized aluminum nitride film, which has an aluminum nitride buffer (AlN-buffer) layer formed on surface of the substrate, and an oxidized-AlN film partially disposed on the AlN-buffer layer, thereby to reduce threading dislocations during a process of forming gallium nitride compound crystal, and to facilitate improving performance of the LED or the semiconductor component.

An object of the present disclosure is provide a semiconductor component with oxidized-AlN film, which mainly has an AlN-buffer layer formed on a patterned surface of the substrate. The patterned surface includes a bottom portion and a plurality of protrusions, the AlN-buffer layer covers a bottom portion and protrusion of the patterned surface. The oxidized-AlN film is disposed on the AlN-buffer layer on the protrusions, the AlN-buffer layer on the bottom portion is not disposed with the oxidized-AlN film.

The present disclosure is mainly to control location for disposing the oxidized-AlN film, according to a structure of the patterned surface of the substrate, to facilitate forming at least one gallium nitride compound crystal on the AlN-buffer layer and the oxidized-AlN film, and to effectively reduce threading dislocations when forming semiconductor epitaxial structure on the substrate.

An object of the present disclosure is to provide a method for manufacturing or semiconductor component with oxidized-AlN film, which is mainly to employ a physical vapor deposition to form an AlN-buffer layer on a patterned surface of a substrate, thereafter to transport the substrate to a vacuum-cooling chamber to cool down. By adjusting a quality of vacuum, temperature and/or cool-down time of the vacuum-cooling chamber, to further control a thickness of an oxidized-AlN film that is formed on the AlN-buffer layer, wherein the thickness is greater than 0.5 nm (nanometer) and less than 4.5 nm for example.

Next to transport the substrate disposed with the AlN-buffer layer and the oxidized-AlN film into a metalorganic chemical vapour deposition (MOCVD) chamber, for depositing gallium nitride compound crystal on the substrate. The MOCVD process is required to be performed in a high-temperature environment about 400° C. or higher, such that the oxidized-AlN film on the substrate is partially burnt out and removed in the high-temperature environment, thereby to partially expose the AlN-buffer layer. Thereafter to form gallium nitride compound crystal on surfaces of the oxidized-AlN film and the exposed AlN-buffer layer. The gallium nitride compound has different growth rates on the surface of the oxidized-AlN film and the surface of the AlN-buffer layer, such that to facilitate reducing threading dislocations during a process of growing the epitaxial structure.

An object of the present disclosure is to provide a method for manufacturing semiconductor component with oxidized-AlN film, wherein the substrate for forming the gallium nitride compound crystal includes a patterned surface. The patterned surface includes a bottom portion and a plurality of protrusions on the bottom portion. The present disclosure mainly controls the thickness of the oxidized-AlN film on the AlN-buffer layer by the cool-down process, wherein the thickness of the oxidized-AlN film is greater than 0.5 nm and less than 4.5 nm.

In the process of performing MOCVD to the substrate, the oxidized-AlN film of the chamber burns in the high-temperature environment within the chamber, thereby to partially remove the oxidized-AlN film. To be specific, the oxidized-AlN film on the bottom portion of the patterned surface is removed, thereby to expose the AlN-buffer layer from the bottom portion, such that the protrusions of the patterned surface have the oxidized-AlN film on those surfaces thereof.

When performing the MOCVD on the substrate, the bottom portion with no oxidized-AlN film forms gallium nitride compound crystal in a faster rate, and the protrusions with the oxidized-AlN film forms the gallium nitride compound crystal in a slower rate. Overall, the gallium nitride compound crystal is deposited from the bottom portion of the patterned surface toward a direction which the protrusions bulges up, thereby to form evenly-distributed and flat gallium nitride compound crystals on the patterned surface of the substrate, and to greatly reduce the threading dislocations of gallium nitride compound crystal during the epitaxial growth process.

To accomplish the abovementioned objects, the present disclosure provides an LED with oxidized-AlN film, which includes: a substrate; an AlN-buffer layer disposed on at least one surface of the substrate; an oxidized-AlN film partially disposed on the AlN-buffer layer, with the AlN-buffer layer partially exposed, wherein the oxidized-AlN film has a thickness greater than 0.5 nm and less than 4.5 nm; and an LED epitaxial structure including at least one gallium nitride compound crystal disposed on the oxidized-AlN film and the exposed AlN-buffer layer.

The present disclosure also provides a method for manufacturing LED or semiconductor component with oxidized-AlN film, which includes: forming an AlN-buffer layer on at least one surface of a substrate; transporting the substrate into a vacuum-cooling chamber, cool down the substrate to a temperature equal to or less than 120° C., to form an oxidized-AlN film on the AlN-buffer layer, wherein the oxidized-AlN film has a thickness greater than 0.5 nm and less than 4.5 nm; and transporting the cooled-down substrate into an MOCVD chamber, and forming a gallium nitride compound crystal on the oxidized-AlN film and the AlN-buffer layer of the substrate.

The present disclosure provides also provides another method for manufacturing LED or semiconductor component with oxidized-AlN film, which includes: forming an AlN-buffer layer on a patterned surface of a substrate, wherein the patterned surface includes a plurality of protrusions and at least one bottom portion; transporting the substrate into a vacuum-cooling chamber, and cooling down the substrate to a temperature equal to or less than 120° C., to form an oxidized-AlN film on the AlN-buffer layer, wherein the oxidized-AlN film has a thickness greater than 0.5 nm and less than 4.5 nm; transporting the cooled-down substrate into an MOCVD chamber, and heating the substrate via the MOCVD chamber, to remove the oxidized-AlN film on the bottom portion of the patterned surface, thereby to expose the AlN-buffer layer on the bottom portion of the patterned surface; and forming a gallium nitride compound crystal on the oxidized-AlN film and the exposed AlN-buffer layer of the substrate.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
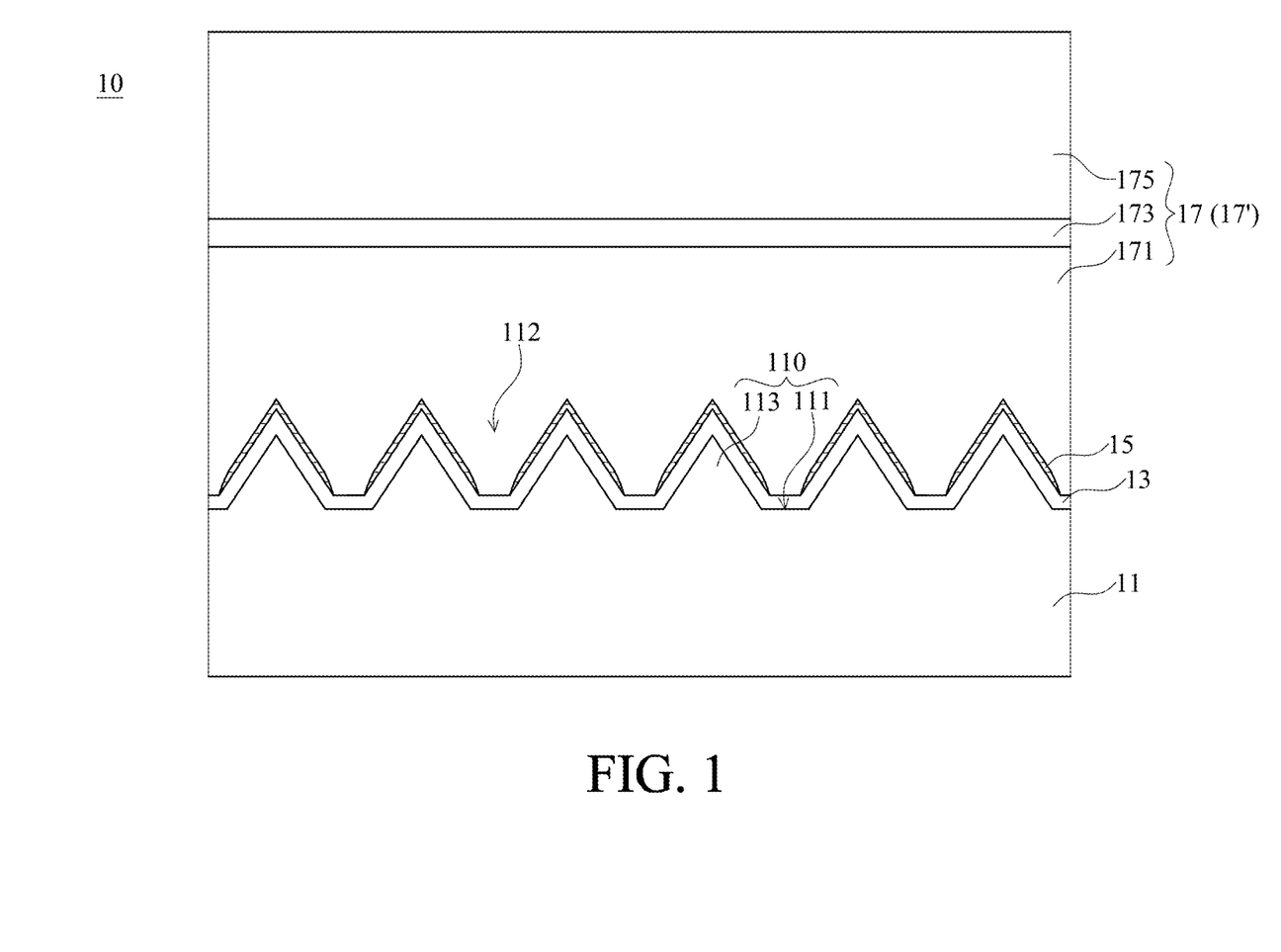
FIG. 1 is a schematic fragmentary sectional view of the lighting-emitting diode (LED) with oxidized aluminum nitride (oxidized-AlN) film, according to one embodiment of the present disclosure.

Referring to FIG. 1, which is a schematic fragmentary sectional view of the light-emitting diode (LED) 10 with oxidized aluminum oxidized film (oxidized-AlN film), according to one embodiment of the present disclosure. As shown, the LED 10 with oxidized-AlN film according to the present disclosure, which includes a substrate 11, at least one aluminum nitride buffer (AlN-buffer) layer 13, at least one oxidized-AlN film 15, and at least one LED epitaxial structure 17. The AlN-buffer layer 13 is disposed on at least one surface of the substrate 11, the oxidized-AlN film 15 is partially disposed the AlN-buffer layer 13, and the semiconductor epitaxial structure 17 is disposed on a surface of the oxidized-AlN film 15 and a surface of the AlN-buffer layer 13.

Specifically, the oxidized-AlN film 15 is only disposed partially on the surface of the AlN-buffer layer 13, a part of the AlN-buffer layer 13 has no oxidized-AlN film 15 disposed thereon with the and therefore partially exposed.

The LED epitaxial structure 17 includes at least one gallium nitride compound crystal, which includes such as an N-type gallium nitride compound 171, a multilayer quantum well 173 and a P-type gallium nitride compound 175 disposed in a stack-up manner. The gallium nitride compound crystal is disposed on the surface of the oxidized-AlN film 15 and the surface of the exposed AlN-buffer layer 13 that has no oxidized-AlN film 15 thereon.

Specifically, the gallium nitride compound crystal has different growth rates on the oxidized-AlN film 15 and on the exposed AlN-buffer layer 13, such as the gallium nitride compound grows and forms up faster on the exposed AlN-buffer layer 13 than it grows on the oxidized-AlN film 15. It is possible to adjust the growth rates of the gallium nitride compound crystal on different areas of the substrate 11, via controlling locations for disposing the oxidized-AlN film 15 and the exposed AlN-buffer layer 13, thereby to form evenly-distributed and flat gallium nitride compound crystal on the substrate 11, and also to greatly reduce threading dislocations of the gallium nitride compound crystal during the epitaxial growth process.

The substrate 11 for growing and forming gallium nitride compound crystal may be sapphire substrate, silicon carbide (SiC) substrate, silicon substrate, diamond substrate, lithium aluminate ($LiAlO_2$) substrate, zinc oxide (ZnO) substrate, tungsten (W) substrate, copper (Cu) substrate, gallium nitride (GaN) substrate, Aluminum gallium nitride (AlGaN) substrate, aluminum nitride (AlN) substrate, soda lime or high-silicon glass substrate, etc., wherein the sapphire substrate and the SiC substrate are mainly employed. The SiC and the GaN has a relatively small difference in crystal size and coefficient of thermal expansion therebetween, therefore the SiC substrate is more suitable for growing and forming gallium nitride compound crystal than the sapphire substrate is. However, the SiC has a higher production cost than the sapphire substrate does, thus still, the sapphire substrate is mainly used by modern industries as the substrate 11 for growing gallium nitride compound crystal.

The sapphire (alumina) and the gallium nitride have about 15% of difference in the crystal size, hence it is a disadvantage for growing high-quality gallium nitride compound crystal on surface of the sapphire substrate. To improve such disadvantage, in 1983, Dr. Yoshida from Japan provided a method of forming AlN on the surface of the sapphire substrate, so called nucleation layer, the method can facilitate growing high-quality gallium nitride compound crystal on the substrate 11.

To further improve the quality of the epitaxial growth of the gallium nitride compound crystal on the substrate 11, an etching process may be performed on the surface of the substrate 11, to form a patterned surface 110 thereon, thereby to transform the substrate 11 into a patterned sapphire substrate (PSS). The PSS can reduce defect density caused by the lattice crystal dislocation of the gallium nitride compound crystal to improve the light efficiency of the LED, meanwhile the patterned surface 110 can reflect the light from the LED to further improve the light efficiency.

Figure 2:
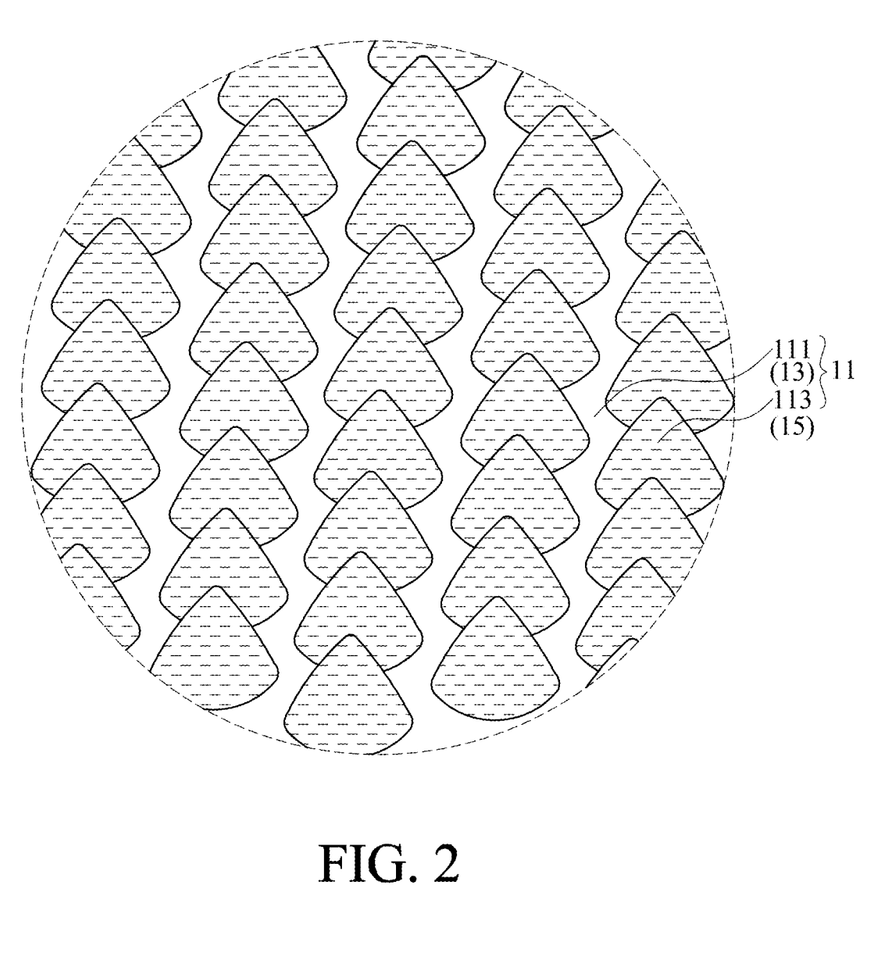
FIG. 2 is a schematic perspective view of a schematic fragmentary perspective view of the LED with oxidized-AlN film, according to one embodiment of the present disclosure.
Figure 3:
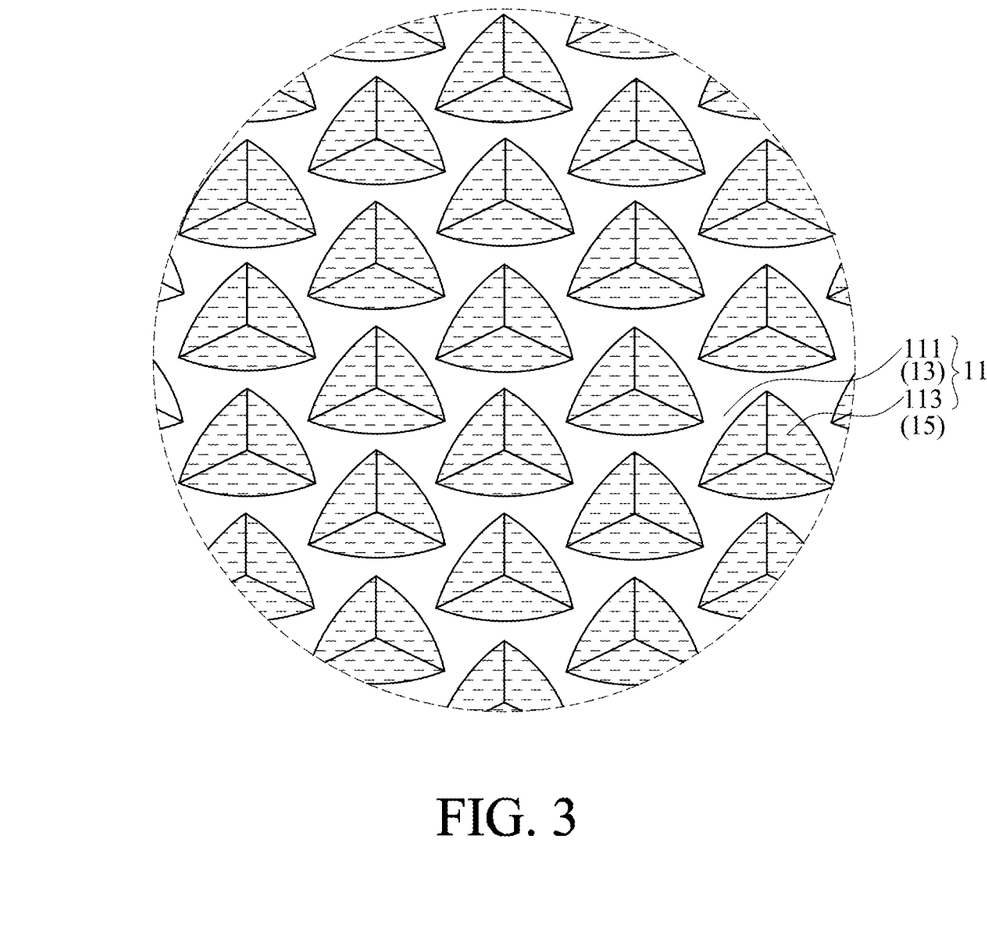
FIG. 3 is a fragmentary top view of a schematic fragmentary perspective view of the LED with oxidized-AlN film, according to one embodiment of the present disclosure.

The LED with oxidized-AlN film and manufacturing method thereof according to the present disclosure, which is more particularly adapted to PSS, wherein the substrate 11 as a PSS has at least one patterned surface 110. Referring to FIG. 2 and FIG. 3, the patterned surface 110 includes at least one bottom portion 111 and a plurality of the protrusion 113. The bottom portion 111 may be such as a flat surface, and have the protrusions 113 arrayed thereon.

The AlN-buffer layer 13 is disposed on the patterned surface 110 of the substrate 11, and covers the surfaces of the bottom portion 111 and the protrusions 113 of the patterned surface 110. The AlN-buffer layer 13 has a thickness less than 500 nanometer (nm), for example. Thereafter, the oxidized-AlN film 15 is formed on the surface of the AlN-buffer layer 13, such as via placing the substrate 11 into a vacuum-cooling chamber (not shown), then to control a cool-down duration, temperature and/or a quality of vacuum within the chamber until the temperature of the substrate 11 is less or equal to 120° C., thereby to form the oxidized-AlN film 15 with a thickness greater than 0.5 nm and less than 4.5 nm.

Next to perform a metalorganic chemical vapour deposition (MOCVD) to the substrate 11, wherein the substrate 11 is heated up during the deposition process, such that to partially burn out and remove the oxidized-AlN film 15, and to partially expose AlN-buffer layer 13 uncovered from the removed oxidized-AlN film 15. The MOCVD is performed at a temperature around or more than 400° C., for example.

According to the present disclosure, it is most preferable to heat and remove the oxidized-AlN film 15 right on or above the bottom portion 111 of the patterned surface 110, and leave the oxidized-AlN film 15 right on or above the protrusions 113 remain. It is the most preferable have the patterned surface 110 disposed with no oxidized-AlN film 15 on the bottom portion 111 and with the protrusions 113 covered by the oxidized-AlN film 15, however a temperature distribution within the chamber may be uneven in practical use, therefore some of the oxidized-AlN film 15 may still remain on the bottom portion 111, or some of the oxidized-AlN film 15 may be removed from the protrusions 113. Thus, claim scope of the present disclosure is not limited to have the oxidized-AlN film 15 completely removed from the bottom portion 111, or to have all of the protrusions 113 on the AlN-buffer layer 13 covered by the oxidized-AlN film 15.

Figure 5:
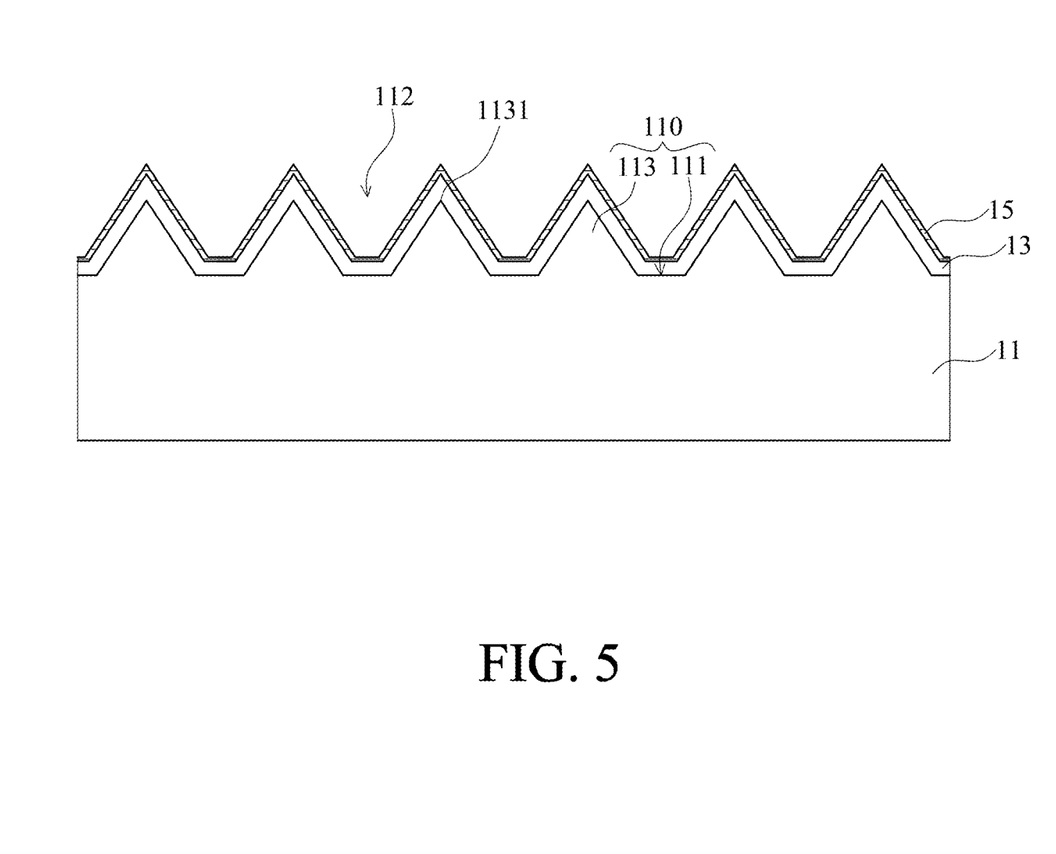
FIG. 5~FIG. 7 are schematic fragmentary sectional views of the LED with oxidized-AlN film in different steps of the manufacturing process, according to one embodiment of the present disclosure.

Referring to FIG. 5, in general, each of the protrusions 113 is formed to protrude from a thick root at the bottom portion 111 with a largest cross section, and taper to a narrow peak 1131. Thereby, each adjacent two of the protrusions 113 form a cavity 112 therebetween, and each of the cavities 112 is formed narrow in a side of the roots and wide in a side of the peaks 1131 of the protrusions 113. Furthermore, in the process of depositing gallium nitride compound crystal on the patterned surface 110, if a deposition rate on the bottom portion 111 is equal to that of the protrusions 113, this may result in an undesirable abutment stress in the narrow side of the cavity 112 nearby the bottom portion 111, and further increase the defect density the gallium nitride compound crystal then affect the light efficiency the LED.

Therefore, the method according to the present disclosure is to dispose or cover the oxidized-AlN film 15 on the protrusions 113 of the patterned surface 110, and have the oxidized-AlN film 15 covering the AlN-buffer layer 13 on the protrusions 113, and to have the bottom portion 111 of the patterned surface 110 disposed with no the oxidized-AlN film 15 and hence exposed from the AlN-buffer layer 13 on the bottom portion 111. The gallium nitride compound crystal 17 is further disposed on the oxidized-AlN film 15 covering on the protrusions 113 and the AlN-buffer layer 13 on the bottom portion 111.

The bottom portion 111 of the patterned surface 110 has no oxidized-AlN film 15 disposed thereon, hence the deposited gallium nitride compound crystal grows on a faster rate and forms an evenly-distributed epitaxy on a surface of the AlN-buffer layer 13 of the bottom portion 111. In the other hand, the protrusions 113 are disposed with the oxidized-AlN film 15, hence the gallium nitride compound grows and forms epitaxy in a slower rate, on the surface of the oxidized-AlN film 15 covering on the protrusions 113.

In a preferable condition, the gallium nitride compound can grow epitaxy from the bottom portion 111 of the patterned surface 110 toward the peaks 1131 of the protrusions 113, and evenly fills up the bottom portion 111 and the cavities 112 of the patterned surface 110, thereby to form evenly-distributed and flat gallium nitride compound crystal on the patterned surface 110 of the substrate 11, and to greatly reduce the defect density occurring while growing the epitaxy, for improving the luminous intensity and brightness of the LED 10 with oxidized-AlN film.

In the abovementioned embodiment, which is mainly exemplified by the LED with oxidized-AlN film, and to dispose LED epitaxial structure 17 on the substrate 11, however in practical use, it is not limited to dispose only the LED epitaxial structure 17 on the substrate 11, but also may dispose other types of semiconductor epitaxial structure on the substrate 11, to form a semiconductor component with oxidized-AlN film on the substrate 11.

To be specific, the method according to the present disclosure may be used to dispose at least one AlN-buffer layer 13 on a patterned surface 110 of the substrate 11, and to dispose the oxidized-AlN film 15 partially on the surface of the AlN-buffer layer 13, thereby to partially expose the AlN-buffer layer 13, wherein the oxidized-AlN film 15 is formed with a thickness greater than 0.5 nm and less than 4.5 nm. Thereby as shown in FIG. 1, at least one semiconductor-epitaxial structure 17' is on the oxidized-AlN film 15 and the exposed AlN-buffer layer 13, wherein the semiconductor-epitaxial structure 17' is made of such as gallium nitride compound and disposed on the substrate 11, to form a semiconductor component such as transistor or diode.

In one embodiment of the present disclosure, before forming the AlN-buffer layer 13 on the substrate 11, a gas-plasma treatment, such as nitrogen-plasma treatment (N2 treatment) may be applied to the substrate 11 partially. To be specific, the N2 treatment can be performed to the protrusions 113 on the patterned surface 110 of the substrate 11, such as to perform to the peaks 1131 of the protrusions 113, thereafter to form the AlN-buffer layer 13 on the patterned surface 110 of the substrate 11 processed by the N2 treatment.

Figure 11:
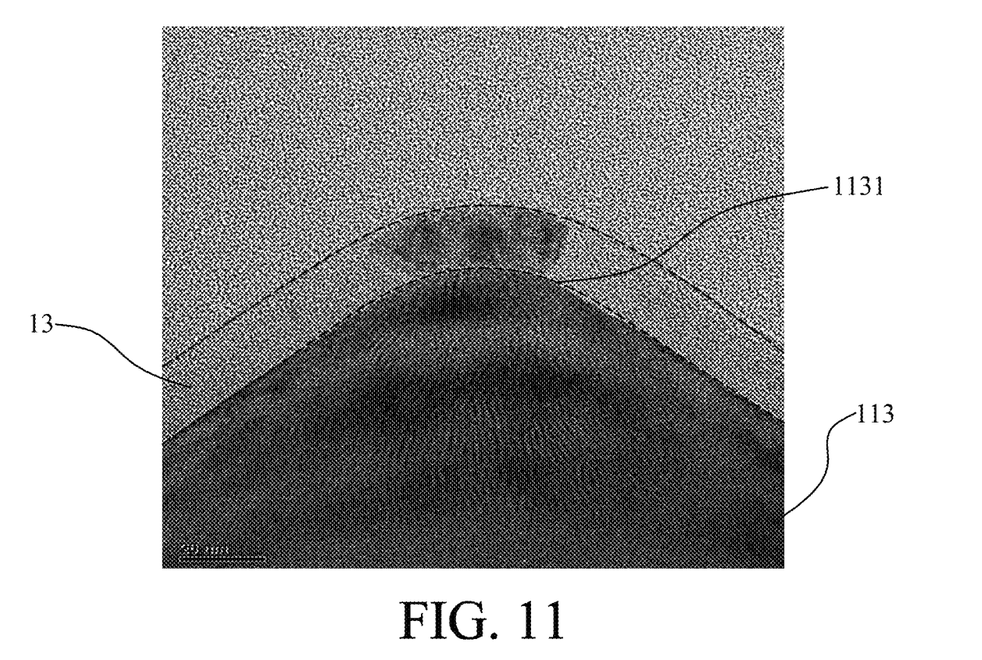
FIG. 11 is a micrographic image of an aluminum nitride buffer (AlN-buffer) layer formed on a substrate which is processed by a gas-plasma treatment, according to one embodiment of the present disclosure.
Figure 12:
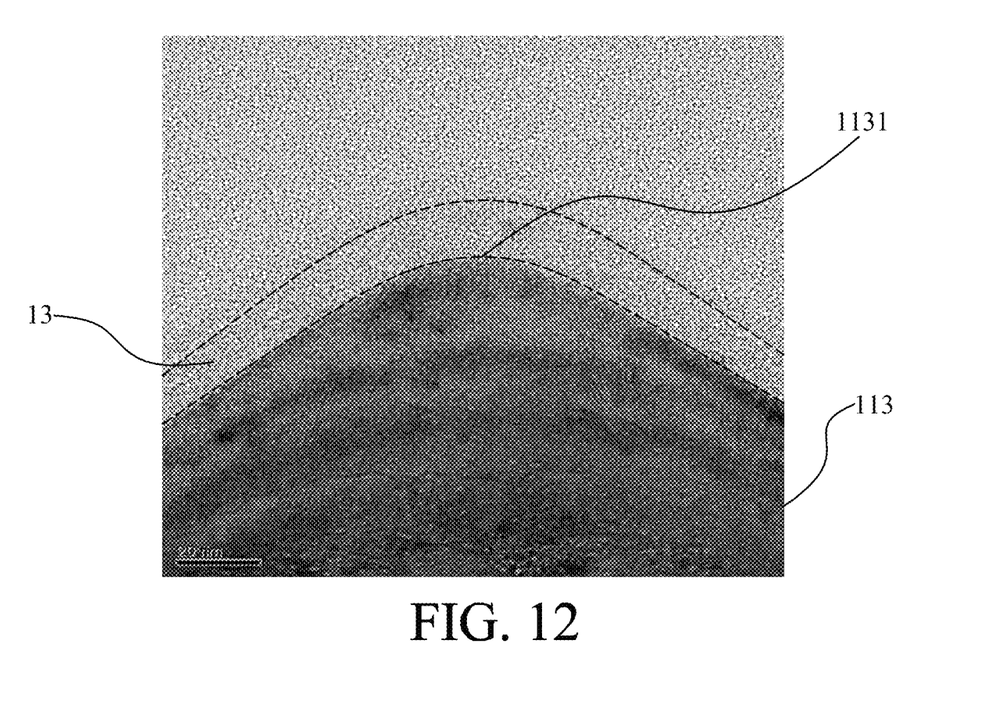
FIG. 12 is a micrographic image of an aluminum nitride buffer (AlN-buffer) layer formed on a substrate without the gas-plasma treatment, according to one embodiment of the present disclosure.

Referring to FIG. 11 and FIG. 12, an AlN-buffer layer 13 formed on a patterned surface 110 processed by the N2 treatment, which has an epitaxial-growth direction different from that of an AlN-buffer layer 13 formed on a patterned surface 110 without the N2 treatment. In one embodiment shown in FIG. 11, as the peaks 1131 of the protrusions 113 on the patterned surface 110 has been processed by the N2 treatment, thereby areas of the AlN-buffer layer 13 formed on the peaks 1131 of the protrusions 113 (shown darker in FIG. 11), which can have an epitaxial-growth direction different from that of other areas of the AlN-buffer layer 13 on the patterned surface 110 (shown lighter in FIG. 11), such as lateral surfaces or the bottom portions 111 of the protrusions 113. In contrary thereto, the AlN-buffer layer 13 formed on the patterned surface 110 without the N2 treatment, which has a more uniform epitaxial-growth direction, as shown in FIG. 12.

By virtue of such treatment, the AlN-buffer layer 13 can have different epitaxial-growth directions in different areas on the patterned surface 110, such that to prevent threading dislocations of the later-disposed semiconductor-epitaxial structure 17' (or the LED epitaxial structure 17) on the AlN-buffer layer 13 and/or the oxidized-AlN film 15.

Figure 4:
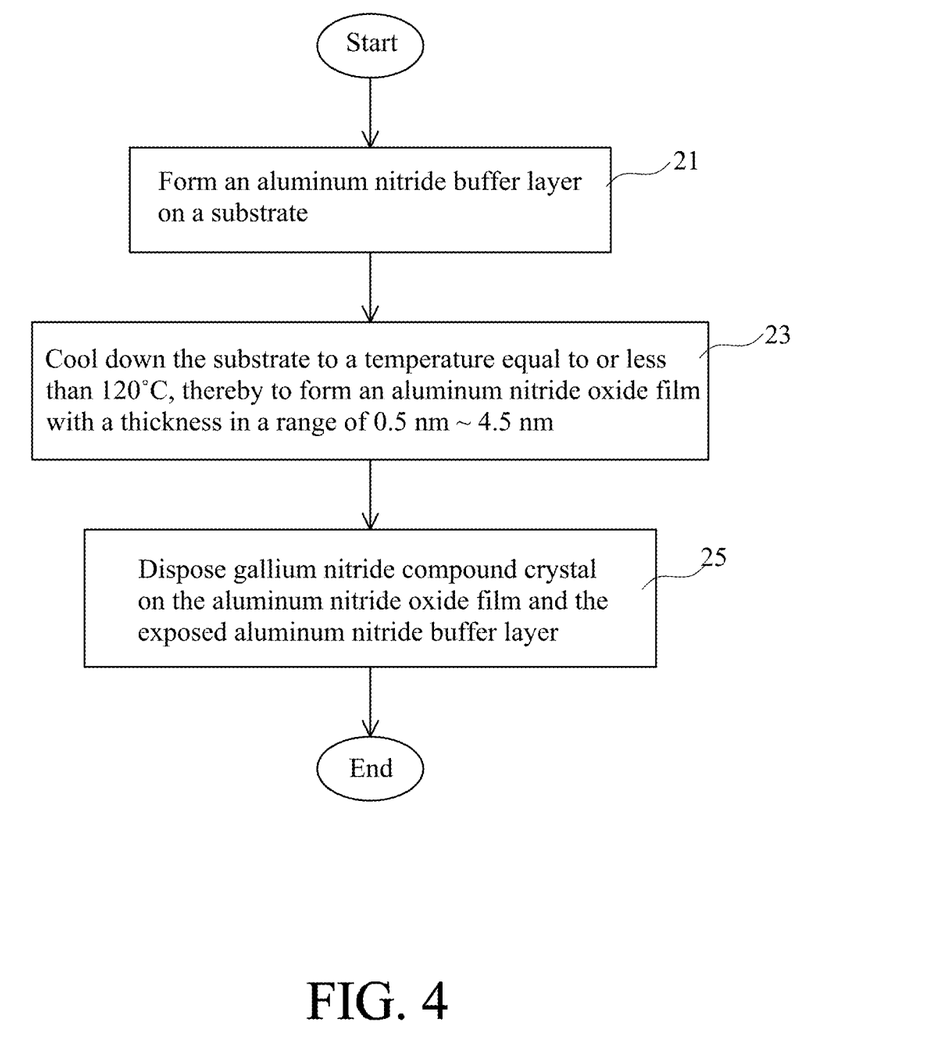
FIG. 4 is a flowchart of manufacturing the LED with oxidized-AlN film, according to one embodiment of the present disclosure.

Referring to FIG. 4, which is a flowchart of manufacturing the LED with oxidized-AlN film, according to one embodiment of the present disclosure. Also referring with FIG. 5~FIG. 7, the manufacturing process is first to provide a substrate 11, and to form AlN-buffer layer 13 on a surface of the substrate 11, as shown by the step 21 in FIG. 4. Specifically, the substrate 11 is formed with a patterned surface 110 thereon, wherein the patterned surface 110 includes at least one bottom portion 111 and a plurality of protrusions 113. The AlN-buffer layer 13 is formed on the patterned surface 110 of the substrate 11, by such as transporting the substrate 11 into a physical-vapor deposition (PVD) chamber, and performing a PVD process on the patterned surface 110 of the substrate 11 to form the AlN-buffer layer 13, wherein the AlN-buffer layer 13 is formed with a thickness about or less than 500 nm.

The AlN-buffer layer 13 evenly covers on the patterned surface 110 of the substrate 11, such as to cover the surfaces of the bottom portion 111 and the protrusions 113 of the patterned surface 110, for facilitating the later steps of forming gallium nitride compound crystal on the substrate 11 with a high quality. It should be noted that, to dispose the AlN-buffer layer 13 on the patterned surface 110 of the substrate 11 via PVD, which is merely one embodiment of the present disclosure and does not limit the claim scope of the present disclosure.

During the PVD process, a temperature of the substrate 11 rises to about 390° C., then next to transfer the substrate 11 at high temperature into a vacuum-cooling chamber to cool down, until the temperature of the substrate 11 is equal to and less than 120° C., more preferable to be equal to and less than 80° C., as shown by step 23 in FIG. 4. During the process of cooling down the substrate 11, the AlN-buffer layer 13 at high temperature reacts with environmental oxygen, to form an oxidized-AlN film 15 on the surface of the AlN-buffer layer 13.

Figure 8:
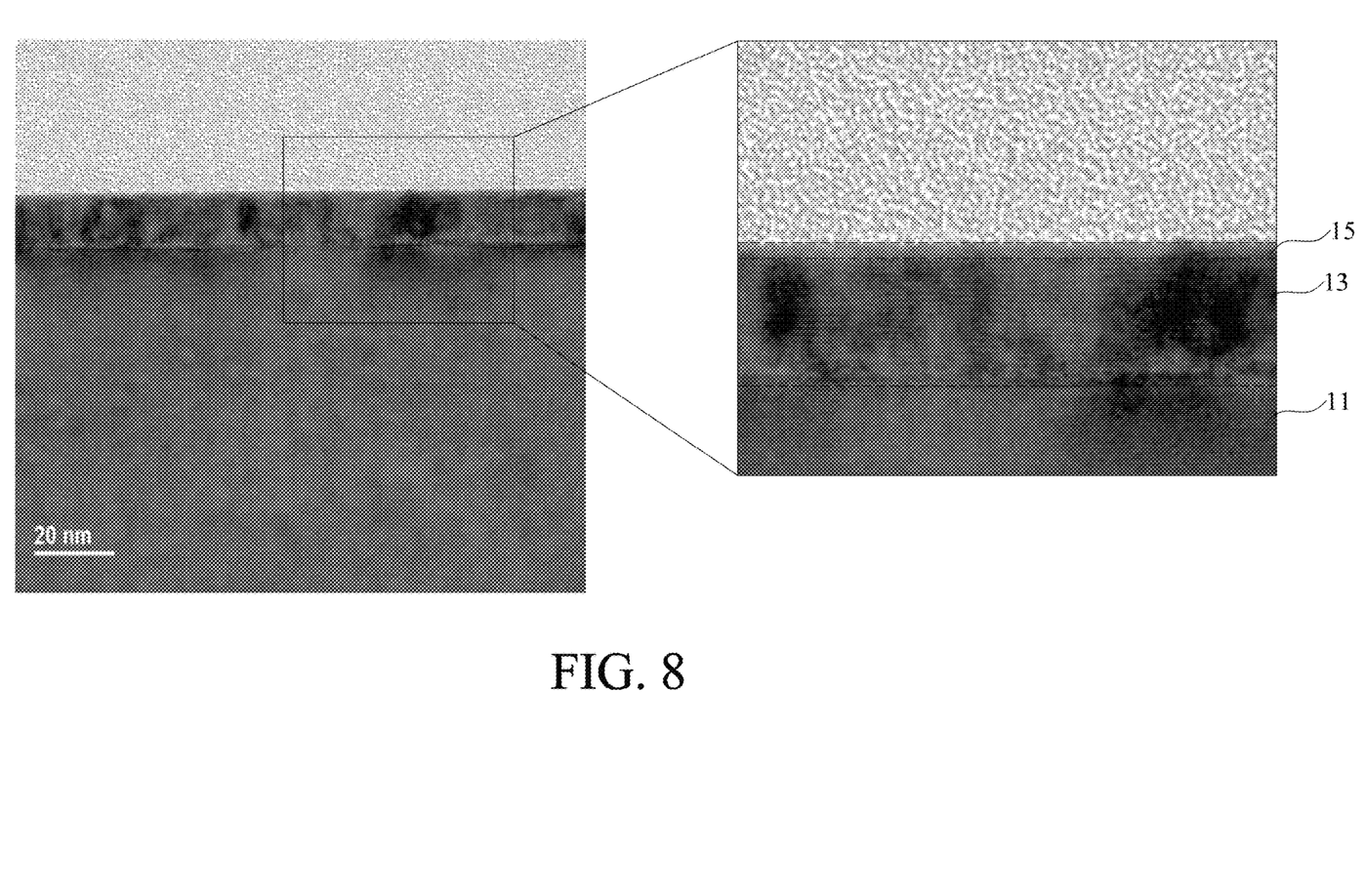
FIG. 8 is a micrographic image of forming an aluminum nitride buffer layer and an oxidized-AlN film on the substrate, according to one embodiment of the present disclosure.

The method according to the present disclosure is to mainly control the temperature, duration and quality of vacuum within the vacuum-cooling chamber for cooling down the substrate 11, thereby to adjust the thickness of the oxidized-AlN film 15 to a range greater than 0.5 nm and less than 4.5 nm, as shown in FIG. 5 and FIG. 8.

Next to transport the cooled-down substrate 11 into an MOCVD chamber, then to grow and form gallium nitride compound crystal on the oxidized-AlN film 15 and the AlN-buffer layer 13 disposed on the substrate 11, as shown by step 25 in FIG. 4. During the MOCVD process, which is for example, to heat up the substrate 11 to about or more than 400° C. via the MOCVD, such that the oxidized-AlN film 15 is burnt out and removed by the high temperature. The method according to the present disclosure is to mainly control a condition of cool down, such that to adjust the thickness of the oxidized-AlN film 15 in a range of 0.5 nm 4.5 nm. During the process of heating up the substrate 11, the oxidized-AlN film 15 is partially removed, thereby the AlN-buffer layer 13 is partially exposed and partially remains covered by the oxidized-AlN film 15.

Figure 6:
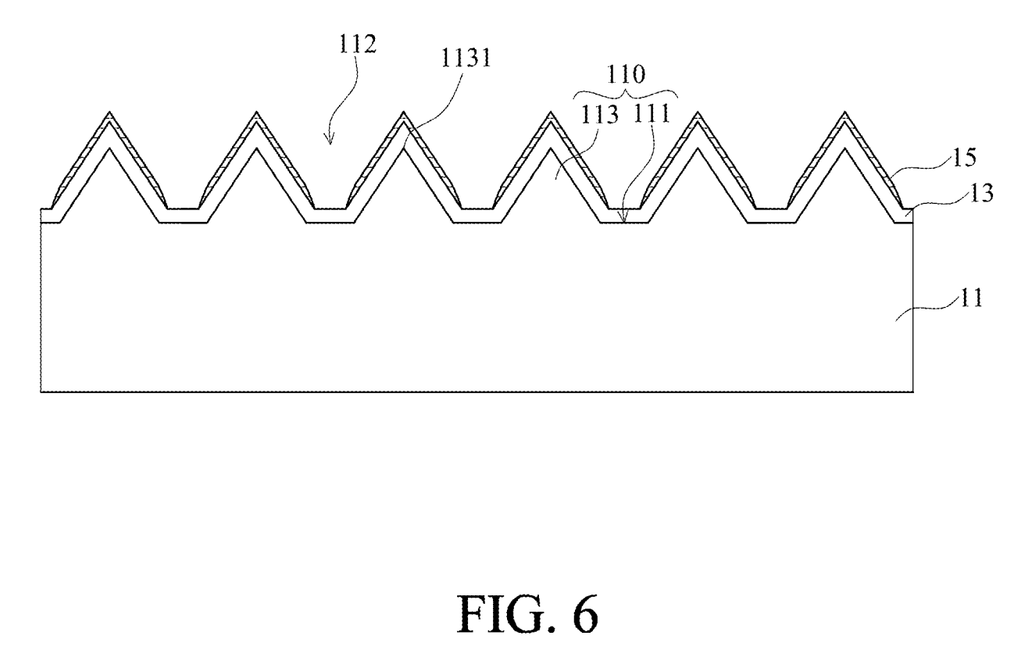

To be specific, as shown in FIG. 5 and FIG. 8, when the thickness of the oxidized-AlN film 15 is greater than 0.5 nm and less than 4.5 nm, the oxidized-AlN film 15 on the bottom portion 111 of the patterned surface 110 of the substrate 11 is burnt out by the high temperature and removed. Thereby as shown in FIG. 6, the AlN-buffer layer 13 above the bottom portion 111 is exposed, and the oxidized-AlN film 15 above the protrusions 113 of the patterned surface 110 remain.

Figure 7:
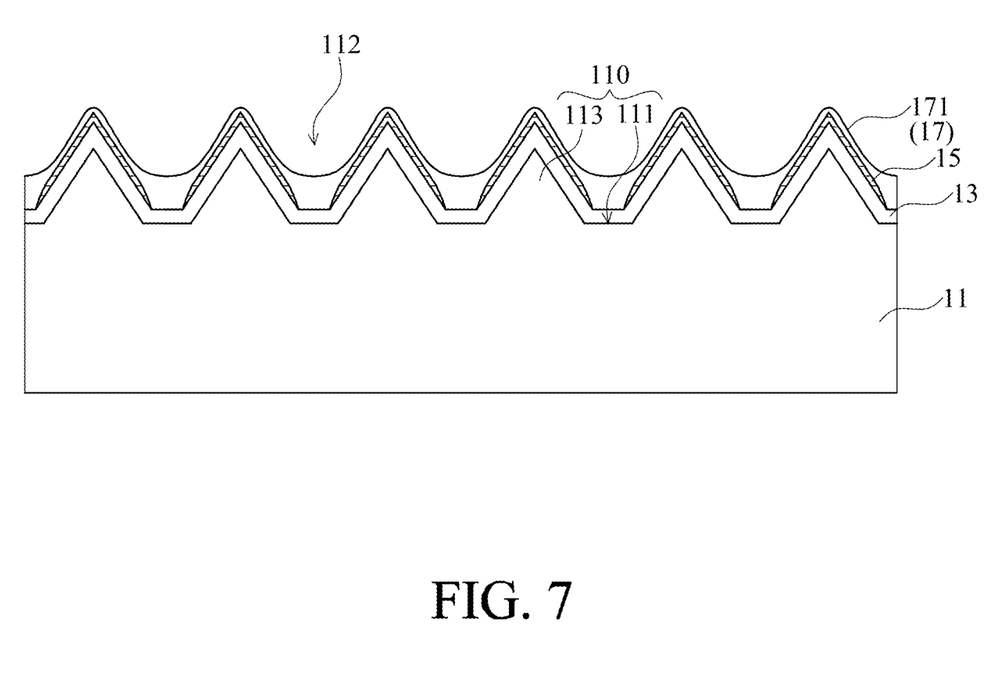

Thereafter as shown in FIG. 7, to perform a deposition for forming gallium nitride compound crystal on the substrate 11, and to grow and form the LED epitaxial structure 17 on the oxidized-AlN film 15 and the exposed AlN-buffer layer 13.

Figure 9:
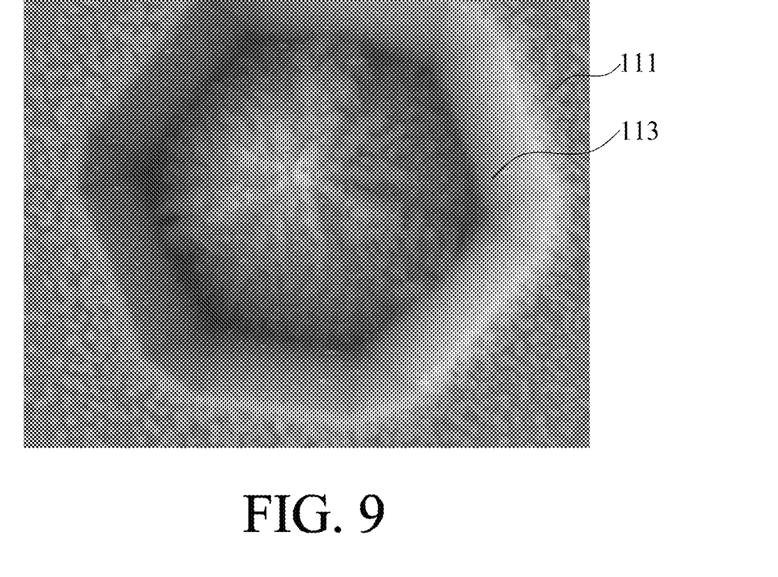
FIG. 9 is a micrographic image of forming a gallium nitride compound on the substrate disposed with the oxidized-AlN film, according to one embodiment of the present disclosure.
Figure 10:
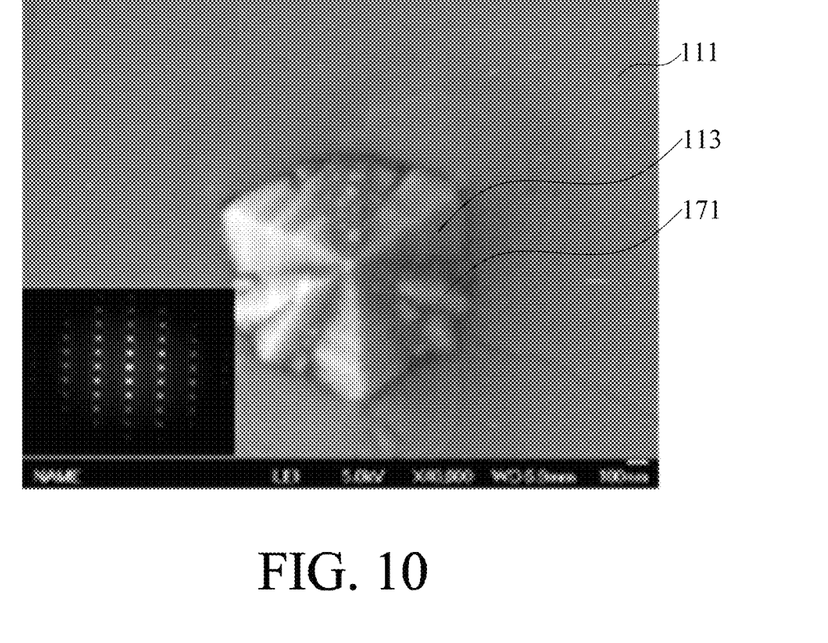
FIG. 10 is a micrographic image of the gallium nitride compound formed on the substrate disposed with the oxidized-AlN film, according to one embodiment of the present disclosure.

According to the present disclosure, the AlN-buffer layer 13 on the bottom portion 111 of the patterned surface 110 is exposed, and the AlN-buffer layer 13 on the protrusions 113 is covered by the oxidized-AlN film 15. The gallium nitride compound crystal then grows and forms on the AlN-buffer layer 13 disposed on the bottom portion 111, with a growth rate faster than that on the oxidized-AlN film 15 disposed on the protrusions 113. As shown in FIG. 9 and FIG. 10, the gallium nitride compound crystal and/or the N-type gallium nitride compound 171 has a greater and faster epitaxial growth rate on the bottom portion 111 of the patterned surface 110 than that on the protrusions 113, and such that to form a thicker gallium nitride compound crystal and/or N-type gallium nitride compound 171 above the bottom portion 111. In the other hand as shown in FIG. 10, if the AlN-buffer layer 13 on the bottom portion 111 and the protrusions 113 all have no oxidized-AlN film 15 thereon, the gallium nitride compound crystal then has an epitaxial growth rate equal to or greater on the AlN-buffer layer 13 covering on the protrusions 113 than that on the AlN-buffer layer 13 covering on the bottom portion 111, and such that to result in an abutment stress during the process of forming the gallium nitride compound crystal, and thereby a great number of threading dislocations may occur in the gallium nitride compound crystal. Under an identical manufacturing condition, the gallium nitride compound has a greater epitaxial growth rate on the protrusions 113 shown in FIG. 10 than that on the protrusions 113 shown in FIG. 9.

By virtue of adjusting the epitaxial growth rate of gallium nitride compound crystal in different areas of the patterned surface 110, it is possible to form evenly-distributed and flat gallium nitride compound crystal on the patterned surface 110, and to reduce the defect density of the gallium nitride compound crystal. Thereafter such as shown in FIG. 1, to sequentially dispose an N-type gallium nitride compound 171, a multilayer quantum well 173 and a P-type gallium nitride compound 175, on the AlN-buffer layer 13 disposed on the bottom portion 111 and the oxidized-AlN film 15 disposed on the protrusions 113.

The following TABLE shows a performance of LED epitaxial structure 17 formed on the substrate 11 disposed with the AlN-buffer layer 13, which is cooled down within the vacuum-cooling chamber at different final temperatures.

| Cool-down temperature of substrate | AlN X-ray FWHM (full-width at half maximum) | GaN X-ray FWHM | Iv (luminous intensity) | Vf (forward voltage) | Ir (reversed current, Yield %) | ESD (electrostatic discharge, Yield %) |
|---|---|---|---|---|---|---|
| 180° C. | 1150 | 166 | 132.4 | 2.96 | 96 | 99.2 |
| 120° C. | 1050 | 152 | 133.3 | 2.98 | 98.8 | 99.8 |
| 80° C. | 960 | 140 | 135.3 | 2.98 | 99.2 | 100 |
| <60° C. | 968 | 138 | 135.1 | 2.97 | 99.6 | 99.8 |

It is apparent as shown in the TABLE, the LED epitaxial structure 17 formed on the substrate 11 cooled down to 120° C., which has a small improvement in luminous intensity comparing with that on the substrate 11 cooled down to 180° C. Furthermore, the LED epitaxial structure 17 formed on the substrate 11 cooled down to 80° C. or even cooler than 60° C., which has an improvement of 2% in the luminous intensity, as shown in Iv column of the TABLE.

Therefore, it is apparent as shown in the TABLE above, by virtue of the LED, semiconductor component with oxidized-AlN film and the manufacturing method thereof according to the present disclosure, which can effectively reduce the defect density of gallium nitride compound crystal, thereby to facilitate improving the luminous intensity, brightness of the LED.

In one embodiment of the present disclosure, before the step 21 (FIG. 4) of forming the AlN-buffer layer 13 on the substrate 11, a gas-plasma treatment such as nitrogen plasma treatment (N2 treatment) may be applied to the substrate 11 partially. To be specific, the N2 treatment can be performed to the protrusions 113 on the patterned surface 110 of the substrate 11, such as to be performed to the peaks 1131 of the protrusions 113, thereafter to form the AlN-buffer layer 13 on the patterned surface 110 of the substrate 11 processed by the N2 treatment.

As aforementioned and shown in FIG. 11 and FIG. 12, an AlN-buffer layer 13 formed on a patterned surface 110 processed by the N2 treatment, which can have an epitaxial-growth direction different from that of an AlN-buffer layer 13 formed on a patterned surface 110 without the N2 treatment. In one embodiment, as the peaks 1131 of the protrusions 113 on the patterned surface 110 has been processed by the N2 treatment, thereby areas of the AlN-buffer layer 13 formed on the peaks 1131 of the protrusions 113 (shown darker in FIG. 11), which can have an epitaxial-growth direction different from that of other areas of the in other areas of the AlN-buffer layer 13 on the patterned surface 110 (shown lighter in FIG. 11), such as the lateral surfaces or the bottom portions 111 of the protrusions 113. In contrary thereto, the AlN-buffer layer 13 formed on the patterned surface 110 without the N2 treatment, which has a more uniform epitaxial-growth direction, as shown in FIG. 12.

By virtue of such treatment, the AlN-buffer layer 13 can have different epitaxial-growth direction in different areas on the patterned surface 110, to prevent threading dislocations of the later-disposed semiconductor-epitaxial structure 17' (or the LED epitaxial structure 17) on the AlN-buffer layer 13 and/or the oxidized-AlN film 15.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

I claim:

1. A manufacturing method of semiconductor component with oxidized aluminum nitride (oxidized-AlN) film, comprising:
    forming an aluminum nitride buffer (AlN-buffer) layer on at least one surface of a substrate;
    transporting the substrate into a vacuum-cooling chamber to cool down until a temperature of the substrate is equal to or less than 120° C., thereby to form an oxidized-AlN film on the AlN-buffer layer, wherein the oxidized-AlN film has a thickness greater than 0.5 nanometer (nm) and less than 4.5 nm;
    transporting the cooled-down substrate into a metalorganic chemical vapour deposition (MOCVD) chamber and heating up the substrate within the MOCVD chamber to partially remove the oxidized-AlN film on the substrate, thereby to partially expose the AlN-buffer layer; and
    forming a gallium nitride compound crystal on the oxidized-AlN film and the AlN-buffer layer disposed on the substrate.

2. The manufacturing method according to claim 1, wherein the gallium nitride compound crystal comprises an N-type gallium nitride compound, a multilayer quantum well and a P-type gallium nitride compound disposed in a stack-up manner.

3. The manufacturing method according to claim 1, wherein the substrate is placed into the vacuum-cooling chamber to cool down until the temperature of the substrate is equal to or less than 80° C.

4. The manufacturing method according to claim 1, wherein the substrate comprises a patterned surface, and the AlN-buffer layer is formed on the patterned surface of the substrate.

5. The manufacturing method according to claim 4, further comprising a step of performing a nitrogen-plasma treatment on the patterned surface of the substrate, thereafter to form the AlN-buffer layer on the plasma-treated patterned surface.

6. A manufacturing method of semiconductor component with oxidized aluminum nitride (oxidized-AlN) film, comprising:

forming an aluminum nitride buffer (AlN-buffer) layer on a patterned surface of a substrate, wherein the patterned surface is formed with a plurality of protrusions and at least one bottom portion thereon;

transporting the substrate into a vacuum-cooling chamber to cool down until a temperature of the substrate is equal to or less than 120° C., thereby to form an oxidized-AlN film on the AlN-buffer layer, wherein the oxidized-AlN film has a thickness greater than 0.5 nanometer (nm) and less than 4.5 nm;

transporting the cooled-down substrate into a metalorganic chemical vapour deposition (MOCVD) chamber and heating up the substrate within the MOCVD chamber to remove the oxidized-AlN film on the at least one bottom portion formed on the patterned surface, thereby to expose the AlN-buffer layer on the at least one bottom portion formed on the patterned surface, wherein the MOCVD chamber heat up the substrate to a temperature equal to or more than 400° C.; and forming a gallium nitride compound crystal on the oxidized-AlN film and the exposed AlN-buffer layer on the substrate.

7. The manufacturing method according to claim 6, wherein the substrate is placed into the vacuum-cooling chamber to cool down until the temperature of the substrate is equal to or less than 80° C.

8. The manufacturing method according to claim 6, wherein the gallium nitride compound crystal comprises an N-type gallium nitride compound, a multilayer quantum well and a P-type gallium nitride compound disposed in a stack-up manner.

9. The manufacturing method according to claim 6, wherein each adjacent two of the protrusions form a cavity therebetween, and each of the cavities is formed narrow in a side of roots of the protrusions and wide in a side of peaks of the protrusions.

10. The manufacturing method according to claim 6, further comprising a step of performing a nitrogen-plasma treatment on the patterned surface of the substrate, thereafter to form the AlN-buffer layer on the plasma-treated patterned surface.

11. The manufacturing method according to claim 6, wherein: each of the protrusions has a peak; and the manufacturing method further comprising a step of performing a nitrogen-plasma treatment to the peaks of the protrusions of the patterned surface of the substrate, thereafter to form the AlN-buffer layer on the patterned surface processed by the nitrogen-plasma treatment.

* * * * *